(12) United States Patent
Na et al.

(10) Patent No.: US 11,605,959 B2
(45) Date of Patent: Mar. 14, 2023

(54) BATTERY CONTROL SYSTEM-IN-PACKAGE AND METHOD OF FABRICATING THE SAME

(71) Applicant: ITM SEMICONDUCTOR CO., LTD., Chungcheongbuk-do (KR)

(72) Inventors: Hyuk Hwi Na, Chungcheongbuk-do (KR); Ho Seok Hwang, Gyeonggi-do (KR); Ja Guen Gu, Chungcheongbuk-do (KR); Chi Sun Song, Chungcheongbuk-do (KR); Seong Beom Park, Chungcheongbuk-do (KR); Sun Ho Kim, Gyeonggi-do (KR)

(73) Assignee: ITM SEMICONDUCTOR CO., LTD., Chungcheongbuk-Do (KR)

( * ) Notice: Subject to any disclaimer, the term of this patent is extended or adjusted under 35 U.S.C. 154(b) by 309 days.

(21) Appl. No.: 17/159,729

(22) Filed: Jan. 27, 2021

(65) Prior Publication Data
US 2021/0257846 A1 Aug. 19, 2021

(30) Foreign Application Priority Data
Feb. 18, 2020 (KR) .................. 10-2020-0019898

(51) Int. Cl.
| | | |
|---|---|---|
| H02J 7/04 | (2006.01) | |
| H02J 7/00 | (2006.01) | |
| H02J 7/02 | (2016.01) | |
| H01L 25/00 | (2006.01) | |
| H01L 25/065 | (2023.01) | |
| H01L 23/495 | (2006.01) | |

(52) U.S. Cl.
CPC ...... *H02J 7/0042* (2013.01); *H01L 23/49575* (2013.01); *H01L 25/0655* (2013.01); *H01L 25/50* (2013.01); *H02J 7/0029* (2013.01); *H02J 7/02* (2013.01)

(58) Field of Classification Search
None
See application file for complete search history.

(56) References Cited

U.S. PATENT DOCUMENTS

| | | | |
|---|---|---|---|
| 2010/0165585 A1 | 7/2010 | Lin | |
| 2013/0043833 A1 | 2/2013 | Katz | |
| 2014/0021522 A1 | 1/2014 | Lin | |
| 2016/0141594 A1* | 5/2016 | Hwang | .......... H02H 7/18 429/7 |
| 2018/0033725 A1* | 2/2018 | Liang | .......... H01L 28/10 |
| 2018/0048167 A1* | 2/2018 | Tanaka | .......... H02J 7/0042 |

FOREIGN PATENT DOCUMENTS

| | | |
|---|---|---|
| KR | 1020090117315 | 11/2009 |
| KR | 20110099338 A | 9/2011 |
| KR | 20120062792 A | 6/2012 |
| KR | 1017259050000 | 4/2017 |

\* cited by examiner

*Primary Examiner* — Michael Lebentritt
(74) *Attorney, Agent, or Firm* — Mayer & Williams, PC; Stuart H. Mayer

(57) ABSTRACT

Provided is a battery control system-in-package including a package substrate, a wireless charger integrated circuit (IC) module mounted on the package substrate, a wired charger IC module mounted on the package substrate, a battery protection IC module mounted on the package substrate, and a single mold provided on the package substrate to encapsulate the wireless charger IC module, the wired charger IC module, and the battery protection IC module.

16 Claims, 4 Drawing Sheets

BATTERY CONTROL SYSTEM-IN-PACKAGE AND METHOD OF FABRICATING THE SAME

CROSS-REFERENCE TO RELATED PATENT APPLICATION

This application claims the benefit of Korean Patent Application No. 10-2020-0019898, filed on Feb. 18, 2020, in the Korean Intellectual Property Office, the disclosure of which is incorporated herein in its entirety by reference.

BACKGROUND

1. Field

The present invention relates to a battery control system and, more particularly, to a battery control system-in-package and a method of fabricating the same.

2. Description of the Related Art

Batteries are generally used in electronic devices such as mobile phones, personal digital assistants (PDAs), and smart watches. As a battery most commonly used in mobile devices, etc., a lithium ion battery is heated when overcharge or overcurrent occurs, and experiences performance degradation and even has the risk of explosion when heating is continued to increase the temperature thereof. Accordingly, a battery protection circuit for controlling battery operation is required to prevent the performance degradation.

In general, a protection circuit package including a protection integrated circuit (IC) for detecting and blocking overcharge, overdischarge, and overcurrent is included in a battery, and a wired charging package including a wired charger integrated circuit (IC) is mounted on a main board of a product using the battery. For a product having a wireless charging function, a wireless charging package including a wireless charger IC and a wired charging package including a wired charger IC are individually mounted on a main board, and a protection circuit package is included in a battery.

Therefore, in general, because a plurality of packages need to be mounted on a mainboard and a protection circuit package needs to be included in a battery to control the battery, limitations may be provided on designs of the main board and the battery. Furthermore, because a charger IC is separate from a protection IC, efficient battery management may not be easily performed.

RELATED ART DOCUMENTS

Patent Documents (Patent document 1) 1. Korean Patent Publication No. 10-2009-0117315 (Nov. 12, 2009)
(Patent document 2) 2. Korean Patent Registration No. 10-1725905 (Apr. 5, 2017)

SUMMARY

The present invention provides a battery control system-in-package capable of achieving a small size to increase a design margin and of efficiently managing a battery, and a method of fabricating the same. However, the scope of the present invention is not limited thereto.

According to an aspect of the present invention, there is provided a battery control system-in-package including a package substrate, a wireless charger integrated circuit (IC) module mounted on the package substrate, a wired charger IC module mounted on the package substrate, a battery protection IC module mounted on the package substrate, and a single mold provided on the package substrate to encapsulate the wireless charger IC module, the wired charger IC module, and the battery protection IC module.

The package substrate may include a lead frame including a die mount and input/output (I/O) terminals, the wireless charger IC module, the wired charger IC module, and the battery protection IC module may be mounted on the die mount of the lead frame, and the mold may expose at least portions of the I/O terminals.

The wireless charger IC module may include a first wafer having a wireless charger IC device thereon, the wired charger IC module may include a second wafer having a wired charger IC device thereon, and the first and second wafers may be mounted on the package substrate at a wafer level.

The first wafer may be directly mounted on the package substrate, and the second wafer may be mounted on the first wafer.

The battery protection IC module may include a third wafer having a battery protection IC device thereon and a fourth wafer having a field effect transistor (FET) thereon, and the third and fourth wafers may be mounted on the package substrate at a wafer level.

The fourth wafer may be directly mounted on the package substrate, and the third wafer may be mounted on the fourth wafer.

A ground terminal of the wired charger IC module, a ground terminal of the wireless charger IC module, and a ground terminal of the battery protection IC module may be connected to each other.

A positive charge terminal of the wired charger IC module and a positive charge terminal of the battery protection IC module may be connected to each other.

A voltage output terminal of the wired charger IC module and a voltage output terminal of the wireless charger IC module may be connected to each other.

At least one of the wireless charger IC module, the wired charger IC module, and the battery protection IC module may include at least one passive device mounted on the package substrate.

According to another aspect of the present invention, there is provided a method of fabricating a battery control system-in-package, the method including mounting a wireless charger integrated circuit (IC) module on a package substrate, mounting a wired charger IC module on the package substrate, mounting a battery protection IC module on the package substrate, and forming a single mold on the package substrate to encapsulate the wireless charger IC module, the wired charger IC module, and the battery protection IC module.

The package substrate may include a lead frame including a die mount and input/output (I/O) terminals, the wireless charger IC module, the wired charger IC module, and the battery protection IC module may be mounted on the die mount of the lead frame, and, in the forming of the mold, at least portions of the I/O terminals may be exposed from the mold.

The wireless charger IC module may include a first wafer having a wireless charger IC device thereon, the wired charger IC module may include a second wafer having a wired charger IC device thereon, and, in the mounting of the wireless charger IC module and the wired charger IC module, the first and second wafers may be mounted on the package substrate at a wafer level.

The first wafer may be directly mounted on the package substrate, and the second wafer may be mounted on the first wafer.

The battery protection IC module may include a third wafer having a battery protection IC device thereon and a fourth wafer having a field effect transistor (FET) thereon, and, in the mounting of the battery protection IC module, the third and fourth wafers may be mounted on the package substrate at a wafer level.

The fourth wafer may be directly mounted on the package substrate, and the third wafer may be mounted on the fourth wafer.

BRIEF DESCRIPTION OF THE DRAWINGS

The above and other features and advantages of the present invention will become more apparent by describing in detail embodiments thereof with reference to the attached drawings in which.

DETAILED DESCRIPTION

Figure 1:
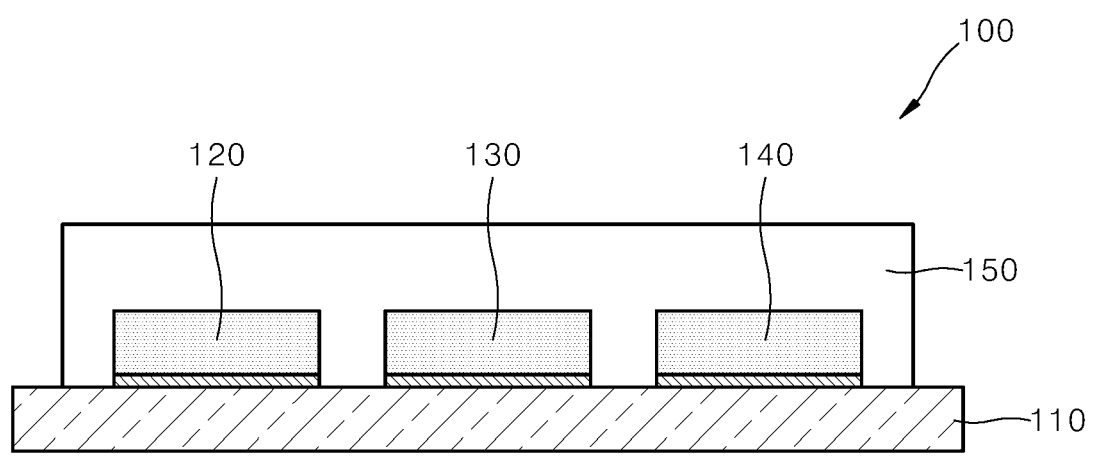
FIG. 1 is a cross-sectional view of a battery control system-in-package according to an embodiment of the present invention.

Hereinafter, the present invention will be described in detail by explaining embodiments of the invention with reference to the attached drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the thicknesses or sizes of layers are exaggerated for clarity or convenience of explanation.

It will be understood that when an element, such as a layer, a region, or a substrate, is referred to as being "on", "connected to", "stacked on", or "coupled to" another element, it may be directly on, connected to, stacked on, or coupled to the other element or intervening elements may be present. In contrast, when an element is referred to as being "directly on", "directly connected to", "directly stacked on", or "directly coupled to" another element or layer, there are no intervening elements or layers present. Like reference numerals denote like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "above", "upper", "beneath", "below", "lower", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to limit the invention. As used herein, the singular forms "a", "an", and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, the embodiments of the invention should not be construed as limited to the particular shapes of regions illustrated herein, but are to include deviations in shapes that result, for example, from manufacturing.

FIG. 1 is a cross-sectional view of a battery control system-in-package 100 according to an embodiment of the present invention.

Referring to FIG. 1, the battery control system-in-package 100 may include a package substrate 110, a wireless charger integrated circuit (IC) module 120, a wired charger IC module 130, a battery protection IC module 140, and a mold 150.

The package substrate 110 is a substrate used to mount components thereon and having wires for connecting the components and may include, for example, a printed circuit board (PCB) or a lead frame.

The PCB is a rigid substrate structure and may include a structure in which a circuit pattern is provided on a core structure. Furthermore, the PCB may include via electrodes to electrically connect components mounted at an upper side to a lower side. The PCB may further include a wiring pattern for rewiring the via electrodes, and external terminals connected to the wiring pattern.

Unlike the PCB, the lead frame itself may be patterned into circuit wires and input/output (I/O) terminals. Furthermore, the lead frame may serve as a heatsink and thus be useful for heat dissipation.

The wireless charger IC module 120 may be mounted on the package substrate 110. For example, the wireless charger IC module 120 may be mounted on the package substrate 110 as a single component or as multiple components. For example, the wireless charger IC module 120 may be mounted on the package substrate 110 by using surface mount technology (SMT).

The wired charger IC module 130 may be mounted on the package substrate 110. For example, the wired charger IC module 130 may be mounted on the package substrate 110 as a single component or as multiple components. For example, the wired charger IC module 130 may be mounted on the package substrate 110 by using SMT.

The battery protection IC module 140 may be mounted on the package substrate 110. For example, the battery protection IC module 140 may be mounted on the package substrate 110 as a single component or as multiple components. For example, the battery protection IC module 140 may be mounted on the package substrate 110 by using SMT.

The mold 150 may be provided on the package substrate 110 to encapsulate the wireless charger IC module 120, the wired charger IC module 130, and the battery protection IC module 140. For example, the mold 150 may be a single structure for simultaneously encapsulating the wireless charger IC module 120, the wired charger IC module 130, and the battery protection IC module 140.

The mold 150 may expose external terminals of the package substrate 110. For example, the mold 150 may expose at least portions of the external terminals of the PCB or the I/O terminals of the lead frame.

For example, the mold 150 may be made of an epoxy molding compound (EMC).

According to the current embodiment, by packaging the wireless charger IC module 120, the wired charger IC module 130, and the battery protection IC module 140, which were individually packaged, into a single package, the battery control system-in-package 100 may simplify a structure and reduce an interface thereof, and thus products using the same may improve space utilization to increase a design margin. Furthermore, by providing the battery protection IC module 140, which was separately provided with a battery, in the battery control system-in-package 100 of a product, battery management efficiency may be increased.

Therefore, the battery control system-in-package 100 may be useful for small products having a low degree of freedom in space, e.g., wearable products.

Figure 2:
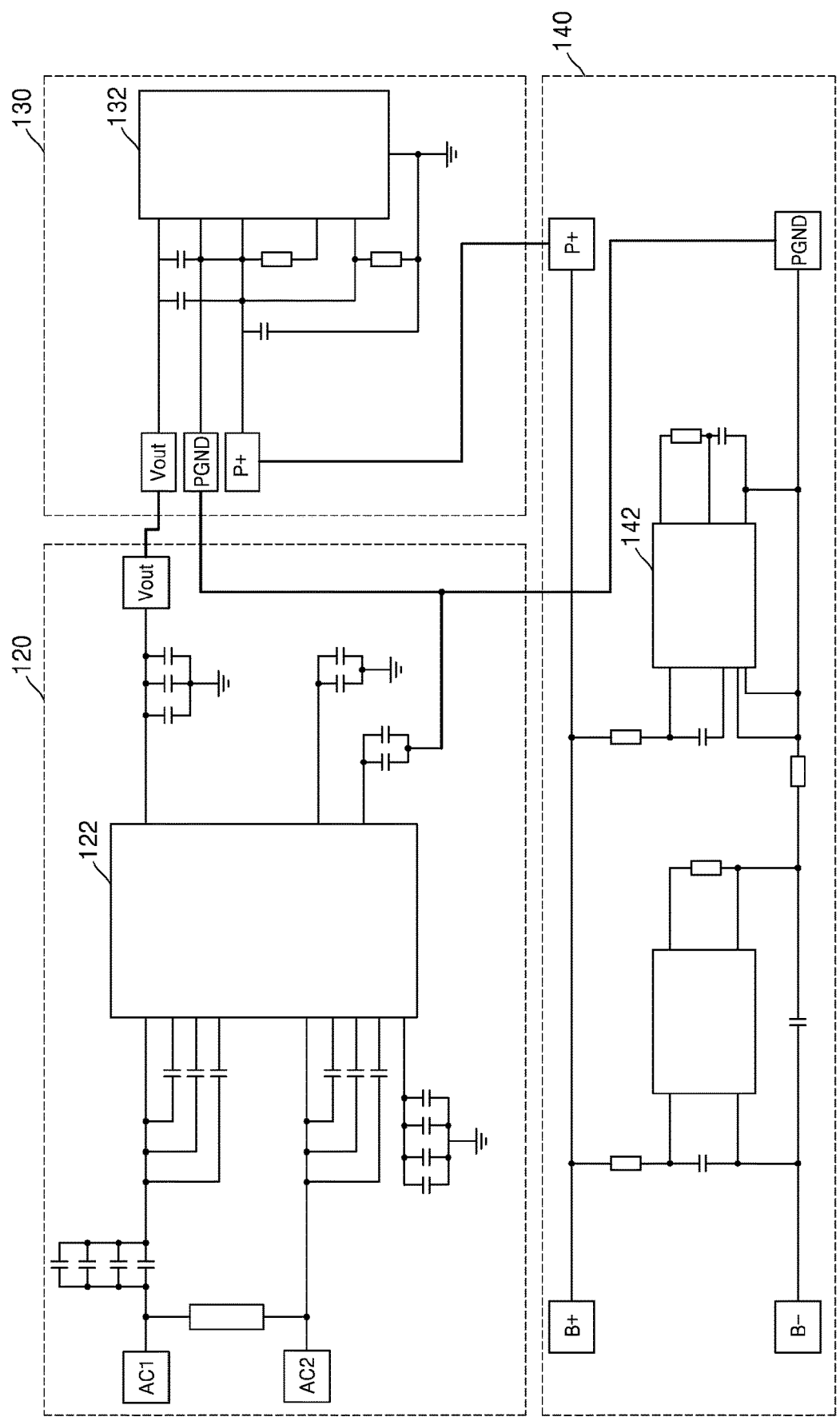
FIG. 2 is a circuit diagram of the battery control system-in-package of FIG. 1.

FIG. 2 is a circuit diagram of the battery control system-in-package 100 of FIG. 1.

Referring to FIG. 2, an example of a circuit configuration of the wireless charger IC module 120, the wired charger IC module 130, and the battery protection IC module 140 may be shown.

The wireless charger IC module 120 may include a wireless charger IC device 122 and a plurality of passive devices, e.g., capacitors and resistors. In the current embodiment, the wireless charger IC device 122 may be provided in the form of a wafer rather than a general packaged chip. The wireless charger IC module 120 may control wireless charge of a product.

For example, the wireless charger IC module 120 may include wireless charge terminals AC1 and AC2 for receiving a wireless charge signal, a voltage output terminal Vout for outputting a voltage signal, and a ground terminal.

The wired charger IC module 130 may include a wired charger IC device 132 and a plurality of passive devices, e.g., capacitors and resistors. In the current embodiment, the wired charger IC device 132 may be provided in the form of a wafer rather than a general packaged chip. The wired charger IC module 130 may control wired charge of a product.

For example, the wired charger IC module 130 may include a positive charge terminal P+, a ground terminal PGND, and a voltage output terminal Vout.

The battery protection IC module 140 may include a battery protection IC device 142, a charge/discharge control transistor, and a plurality of passive devices, e.g., capacitors and resistors. In the current embodiment, the battery protection IC device 142 may be provided in the form of a wafer rather than a general packaged chip. The battery protection IC module 140 may protect a battery from overcharge, overdischarge, overcurrent, overvoltage, etc.

Specifically, the battery protection IC module 140 may include devices for protecting the battery during a battery operation, e.g., a charge and discharge operation. For example, the battery protection IC module 140 may include at least one transistor, e.g., a field effect transistor (FET), the battery protection IC device 142, and passive devices.

The battery protection IC device 142 may monitor a voltage and control an on/off operation of the FET to control a charge or discharge operation. For example, the battery protection IC device 142 may turn off the FET when overcurrent or overdischarge is detected in a battery discharge operation or when overcurrent or overcharge is detected in a battery charge operation. The passive devices may include at least one resistor and at least one capacitor.

For example, the battery protection IC module 140 may include battery terminals B+ and B− connected to a battery, a positive charge terminal P+ connected to a product or a charger, and a ground terminal PGND.

In some embodiments, the ground terminal of the wireless charger IC module 120, the ground terminal PGND of the wired charger IC module 130, and the ground terminal PGND of the battery protection IC module 140 may be connected to each other.

In some embodiments, the positive charge terminal P+ of the wired charger IC module 130 and the positive charge terminal P+ of the battery protection IC module 140 may be connected to each other.

In some embodiments, the voltage output terminal Vout of the wireless charger IC module 120 and the voltage output terminal Vout of the wired charger IC module 130 may be connected to each other.

As such, by packaging the wireless charger IC module 120, the wired charger IC module 130, and the battery protection IC module 140 into a single package, terminals may be shared and thus the battery control system-in-package 100 may be reduced in size.

Figure 3:
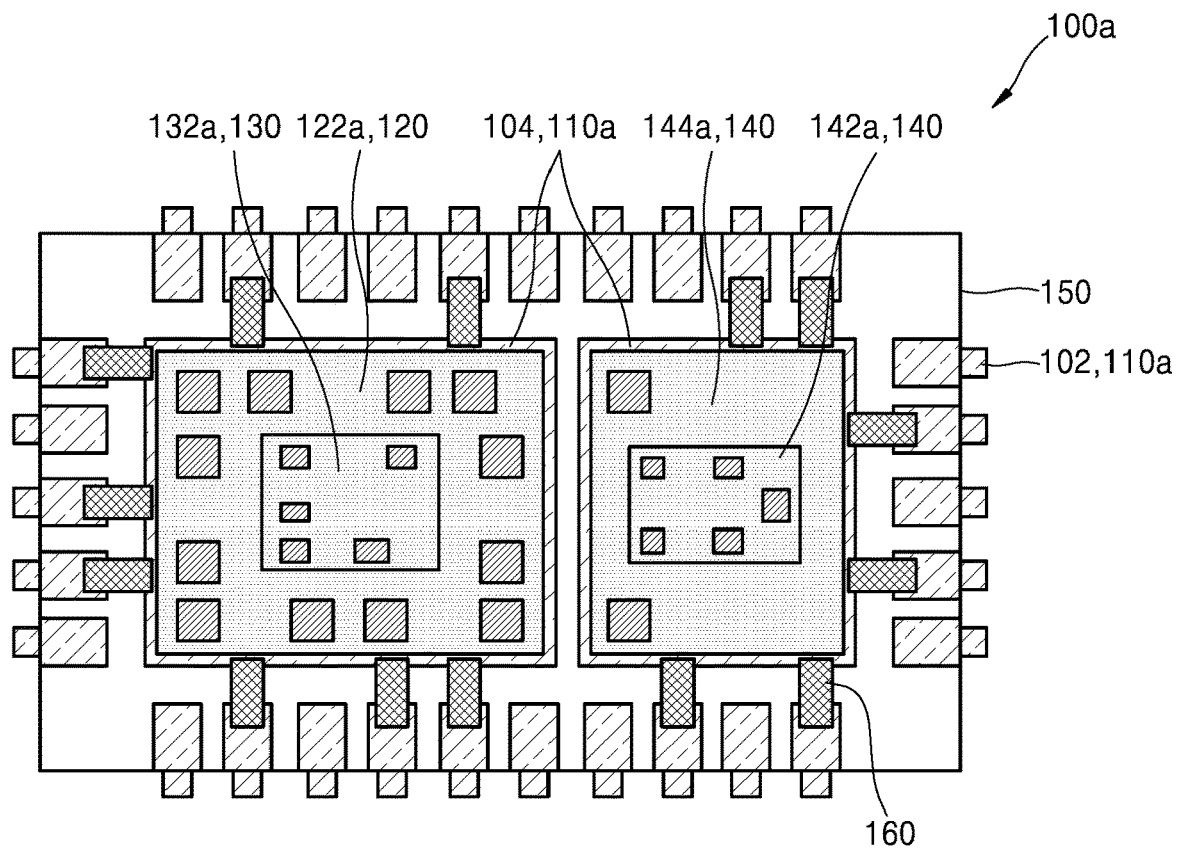
FIG. 3 is a plan view of a battery control system-in-package according to another embodiment of the present invention.

FIG. 3 is a plan view of a battery control system-in-package 100a according to another embodiment of the present invention. The battery control system-in-package 100a according to the current embodiment is obtained by specifying the battery control system-in-package 100 of FIG. 1, and thus a repeated description therebetween will not be provided herein.

Referring to FIG. 3, the battery control system-in-package 100a may use a lead frame 110a as the package substrate 110. For example, the lead frame 110a may include a die mount 104 and I/O terminals 102.

The die mount 104 may be used to mount components thereon. For example, at least one or all of the wireless charger IC module 120, the wired charger IC module 130, and the battery protection IC module 140 may be mounted on the die mount 104 of the lead frame 110a.

Furthermore, the die mount 104 may be divided into one or more pieces based on the number of components mounted thereon. For example, the die mount 104 may be divided into two, and the wireless charger IC module 120 and the wired charger IC module 130 may be mounted on one die mount 104 while the battery protection IC module 140 may be mounted on the other die mount 104.

The wireless charger IC module 120 may include a first wafer 122a having the wireless charger IC device 122 thereon, and the wired charger IC module 130 may include a second wafer 132a having the wired charger IC device 132 thereon. Specifically, the first wafer 122a may refer to a structure in which the wireless charger IC device 122 is formed on a semiconductor wafer by using a semiconductor IC process. The second wafer 132a may refer to a structure in which the wired charger IC device 132 is formed on a semiconductor wafer by using a semiconductor IC process.

For example, the first and second wafers 122a and 132a may be mounted on the package substrate 110, e.g., the lead frame 110a, at the wafer level. Herein, being mounted at the wafer level may mean that the first and second wafers 122a and 132a are mounted in a wafer state without being individually packaged.

In an embodiment, the first wafer 122a may be directly mounted on the package substrate 110, e.g., the lead frame 110a, and the second wafer 132a may be mounted on the first wafer 122a. Herein, the fact that the first wafer 122a is directly mounted on the lead frame 110a means that another wafer or structure is not interposed but solder or adhesive required in a mounting process may be interposed therebetween.

In this manner, the size, e.g., a footprint, of the lead frame 110a may be reduced by mounting the first and second wafers 122a and 132a on the lead frame 110a in a stacked structure.

In an embodiment, the battery protection IC module 140 may include a third wafer 142a having the battery protection IC device 142 thereon and a fourth wafer 144a having a FET thereon. Specifically, the third wafer 142a may refer to a structure in which the battery protection IC device 142 is formed on a semiconductor wafer by using a semiconductor IC process. The fourth wafer 144a may refer to a structure in which one or more FETs are formed on a semiconductor wafer by using a semiconductor IC process. The FET may be used to switch between charge and discharge, and be provided in a single or dual structure.

The third and fourth wafers 142a and 144a may be mounted on the package substrate 110, e.g., the lead frame 110a, at the wafer level. Herein, being mounted at the wafer level may mean that the third and fourth wafers 142a and 144a are mounted in a wafer state without being individually packaged.

In an embodiment, the fourth wafer 144a may be directly mounted on the package substrate 110, e.g., the lead frame 110a, and the third wafer 142a may be mounted on the fourth wafer 144a. Herein, the fact that the fourth wafer 144a is directly mounted on the lead frame 110a means that another wafer or structure is not interposed but solder or adhesive required in a mounting process may be interposed therebetween.

In this manner, the size, e.g., a footprint, of the lead frame 110a may be reduced by mounting the third and fourth wafers 142a and 144a on the lead frame 110a in a stacked structure.

Passive devices 160, e.g., capacitors or resistors, may be further mounted on the package substrate 110, e.g., the lead frame 110a, to achieve a required circuit configuration, e.g., the circuit configuration of FIG. 2. For example, the passive devices 160 may be mounted on portions designed to configure circuits in a space of the lead frame 110a where the first to fourth wafers 122a, 132a, 142a, and 144a are not mounted.

The first to fourth wafers 122a, 132a, 142a, and 144a may include I/O pads, and these I/O pads may be connected to each other or be electrically connected to the I/O terminals 102 of the lead frame 110a by using appropriate connection means, e.g., wire bonding.

The mold 150 may be provided on the lead frame 110a to encapsulate the wireless charger IC module 120, the wired charger IC module 130, and the battery protection IC module 140 and expose at least portions of the I/O terminals 102. For example, the mold 150 may be provided on the lead frame 110a to encapsulate the first to fourth wafers 122a, 132a, 142a, and 144a and the passive devices 160 and expose ends of the I/O terminals 102.

The battery control system-in-package 100a according to the current embodiment may be reduced in size by mounting the wireless charger IC module 120, the wired charger IC module 130, and the battery protection IC module 140 on one lead frame 110a into a single package, and be further reduced in size by mounting the first to fourth wafers 122a, 132a, 142a, and 144a at the wafer level in a partially stacked structure.

Figure 4:
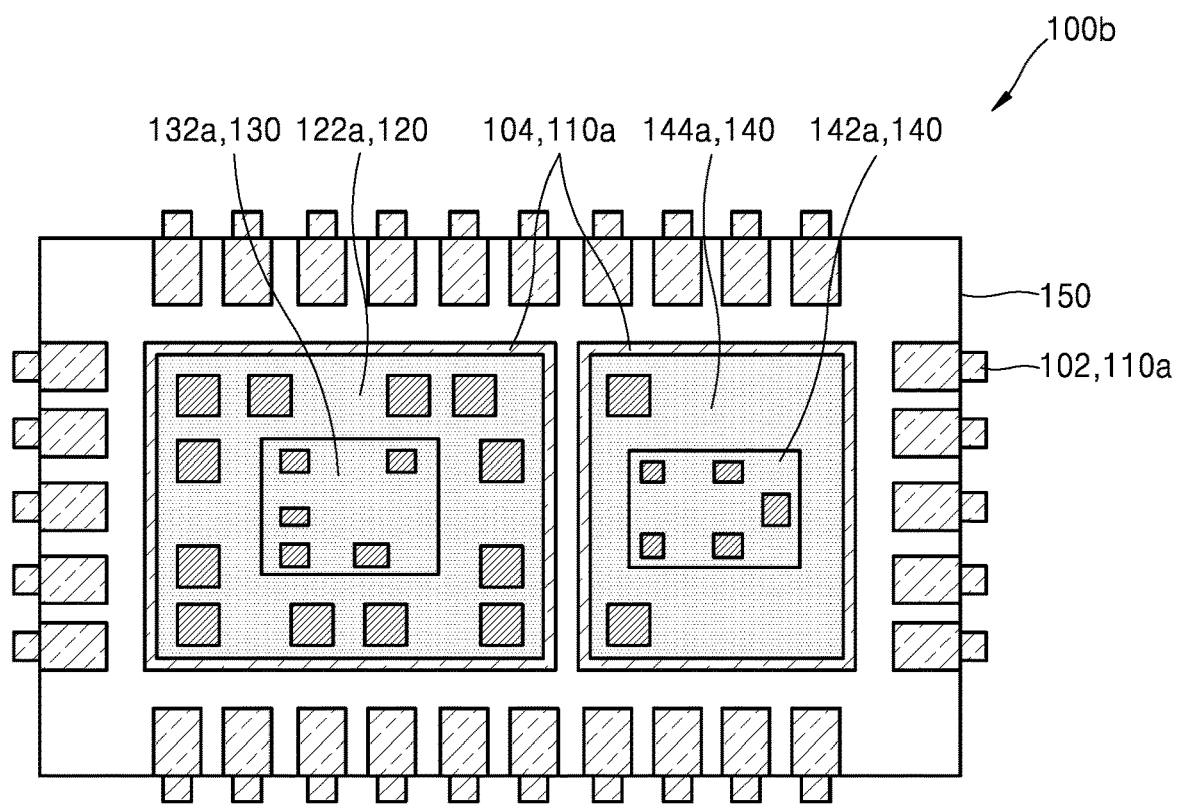
FIG. 4 is a plan view of a battery control system-in-package according to another embodiment of the present invention.

FIG. 4 is a plan view of a battery control system-in-package 100b according to another embodiment of the present invention. The battery control system-in-package 100b according to the current embodiment is obtained by modifying or omitting some elements of the battery control system-in-package 100a of FIG. 3, and thus a repeated description therebetween will not be provided herein.

Referring to FIG. 4, unlike the battery control system-in-package 100a of FIG. 3, the battery control system-in-package 100b may not include the passive devices 160. Therefore, the battery control system-in-package 100b may mount only the first to fourth wafers 122a, 132a, 142a, and 144a thereon.

In this case, when used in a product, the battery control system-in-package 100b needs to be connected to another structure including the passive devices 160 to achieve the circuit configuration of FIG. 2. For example, the battery control system-in-package 100b may be mounted on a main board including the passive devices 160.

The above-described battery control system-in-package 100b may be used in products having various configurations of the passive devices 160. In this case, the battery control system-in-package 100b may provide common ICs and various configurations of the passive devices 160 may be provided on the main board appropriately for the products.

Figure 5:
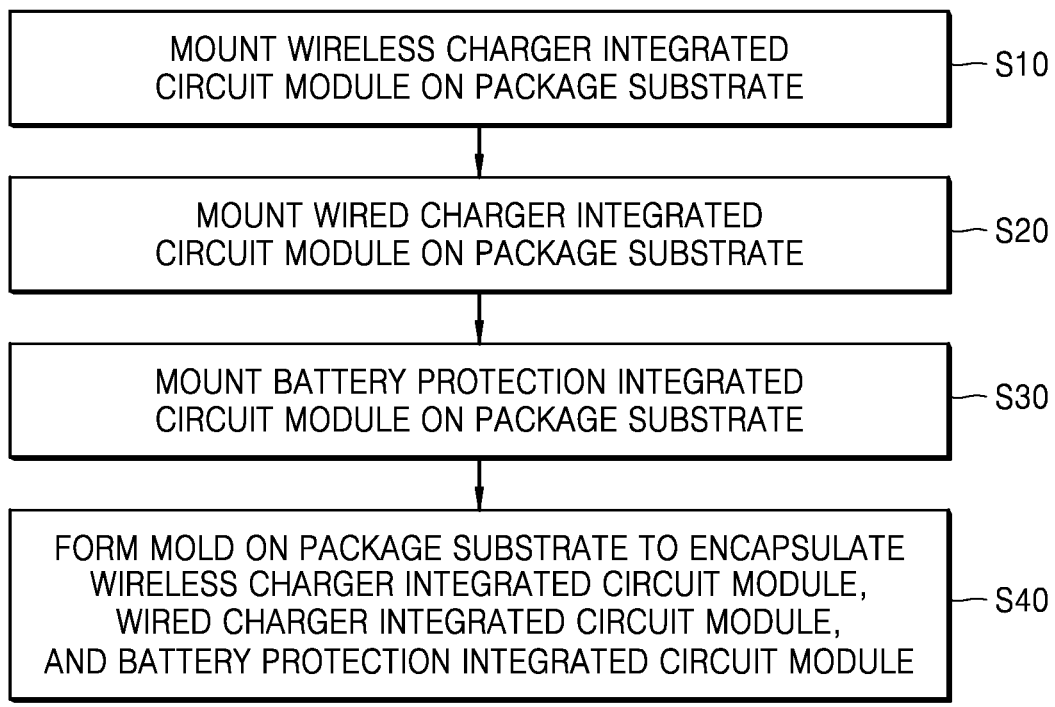
FIG. 5 is a flowchart of a method of fabricating a battery control system-in-package, according to an embodiment of the present invention.

FIG. 5 is a flowchart of a method of fabricating a battery control system-in-package, according to an embodiment of the present invention.

Referring to FIGS. 1 to 5 together, initially, the package substrate 110 processed to form a required circuit configuration, e.g., the lead frame 110a, may be prepared.

Then, the wireless charger IC module 120 may be mounted (operation S10), the wired charger IC module 130 may be mounted (operation S20), and the battery protection IC module 140 may be mounted (operation S30) on the package substrate 110, e.g., the lead frame 110a. The order of mounting the wireless charger IC module 120, the wired charger IC module 130, and the battery protection IC module 140 may be arbitrarily changed. However, to mount in a stacked structure, a lower structure may be initially mounted and then an upper structure may be mounted.

For example, in FIGS. 3 and 4, the first wafer 122a may be initially mounted on the lead frame 110a and then the second wafer 132a may be mounted on the first wafer 122a. In addition, the fourth wafer 144a may be initially mounted on the lead frame 110a and then the third wafer 142a may be mounted on the fourth wafer 144a. In this case, the order of mounting the first wafer 122a and the fourth wafer 144a may be arbitrarily selected.

Optionally, in FIG. 3, the passive devices 160 may be mounted on the lead frame 110a. The passive devices 160 may be mounted on the lead frame 110a before or after the first to fourth wafers 122a, 132a, 142a, and 144a are mounted.

The above-described mounting process may use a variety of processes, e.g., SMT.

A description of the structure of mounting the first to fourth wafers 122a, 132a, 142a, and 144a and the passive devices 160 is provided above in relation to FIG. 3.

Then, a single mold 150 may be formed on the package substrate 110, e.g., the lead frame 110a, to encapsulate the wireless charger IC module 120, the wired charger IC module 130, and the battery protection IC module 140 (operation S40).

According to the afore-described embodiments of the present invention, a battery control system-in-package capable of achieving a small size to increase a design margin and of increasing battery control efficiency, and a method of fabricating the same may be provided. However, the scope of the present invention is not limited to the above-described effect.

While the present invention has been particularly shown and described with reference to embodiments thereof, it will be understood by one of ordinary skill in the art that various changes in form and details may be made therein without departing from the scope of the present invention as defined by the following claims.

What is claimed is:

1. A battery control system-in-package comprising:
   a package substrate;
   a wireless charger integrated circuit (IC) module mounted on the package substrate;
   a wired charger IC module mounted on the package substrate;
   a battery protection IC module mounted on the package substrate; and
   a single mold provided on the package substrate to encapsulate the wireless charger IC module, the wired charger IC module, and the battery protection IC module.

2. The battery control system-in-package of claim 1, wherein the package substrate comprises a lead frame comprising a die mount and input/output (I/O) terminals,
   wherein the wireless charger IC module, the wired charger IC module, and the battery protection IC module are mounted on the die mount of the lead frame, and
   wherein the mold exposes at least portions of the I/O terminals.

3. The battery control system-in-package of claim 1, wherein the wireless charger IC module comprises a first wafer having a wireless charger IC device thereon,
   wherein the wired charger IC module comprises a second wafer having a wired charger IC device thereon, and
   wherein the first and second wafers are mounted on the package substrate at a wafer level.

4. The battery control system-in-package of claim 3, wherein the first wafer is directly mounted on the package substrate, and
   wherein the second wafer is mounted on the first wafer.

5. The battery control system-in-package of claim 1, wherein the battery protection IC module comprises a third wafer having a battery protection IC device thereon and a fourth wafer having a field effect transistor (FET) thereon, and
   wherein the third and fourth wafers are mounted on the package substrate at a wafer level.

6. The battery control system-in-package of claim 5, wherein the fourth wafer is directly mounted on the package substrate, and
   wherein the third wafer is mounted on the fourth wafer.

7. The battery control system-in-package of claim 1, wherein a ground terminal of the wired charger IC module, a ground terminal of the wireless charger IC module, and a ground terminal of the battery protection IC module are connected to each other.

8. The battery control system-in-package of claim 1, wherein a positive charge terminal of the wired charger IC module and a positive charge terminal of the battery protection IC module are connected to each other.

9. The battery control system-in-package of claim 1, wherein a voltage output terminal of the wired charger IC module and a voltage output terminal of the wireless charger IC module are connected to each other.

10. The battery control system-in-package of claim 1, wherein at least one of the wireless charger IC module, the wired charger IC module, and the battery protection IC module comprises at least one passive device mounted on the package substrate.

11. A method of fabricating a battery control system-in-package, the method comprising:
    mounting a wireless charger integrated circuit (IC) module on a package substrate;
    mounting a wired charger IC module on the package substrate;
    mounting a battery protection IC module on the package substrate; and
    forming a single mold on the package substrate to encapsulate the wireless charger IC module, the wired charger IC module, and the battery protection IC module.

12. The method of claim 11, wherein the package substrate comprises a lead frame comprising a die mount and input/output (I/O) terminals,
    wherein the wireless charger IC module, the wired charger IC module, and the battery protection IC module are mounted on the die mount of the lead frame, and
    wherein, in the forming of the mold, at least portions of the I/O terminals are exposed from the mold.

13. The method of claim 11, wherein the wireless charger IC module comprises a first wafer having a wireless charger IC device thereon,
    wherein the wired charger IC module comprises a second wafer having a wired charger IC device thereon, and
    wherein, in the mounting of the wireless charger IC module and the wired charger IC module, the first and second wafers are mounted on the package substrate at a wafer level.

14. The method of claim 13, wherein the first wafer is directly mounted on the package substrate, and
    wherein the second wafer is mounted on the first wafer.

15. The method of claim 11, wherein the battery protection IC module comprises a third wafer having a battery protection IC device thereon and a fourth wafer having a field effect transistor (FET) thereon, and
 wherein, in the mounting of the battery protection IC module, the third and fourth wafers are mounted on the package substrate at a wafer level.

16. The method of claim 15, wherein the fourth wafer is directly mounted on the package substrate, and
 wherein the third wafer is mounted on the fourth wafer.

* * * * *